United States Patent
Hsuanyu et al.

(10) Patent No.: US 9,584,073 B1
(45) Date of Patent: Feb. 28, 2017

(54) INTERNALLY MATCHED ACTIVE SINGLE-TO-DIFFERENTIAL RF CONVERTER

(71) Applicant: GM Global Technology Operations LLC, Detroit, MI (US)

(72) Inventors: Pan Hsuanyu, Los Angeles, CA (US); Alexandros Margomenos, San Jose, CA (US); Hasan Sharifi, Agoura Hills, CA (US); Igal Bilik, Rohovot (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 14/877,331

(22) Filed: Oct. 7, 2015

(51) Int. Cl.
*H03F 1/30* (2006.01)
*H03F 3/195* (2006.01)
*H03F 3/19* (2006.01)

(52) U.S. Cl.
CPC .............. *H03F 1/302* (2013.01); *H03F 3/19* (2013.01); *H03F 3/195* (2013.01)

(58) Field of Classification Search
CPC . H03F 1/302; H03F 3/189; H03F 3/01; H03F 3/1959
See application file for complete search history.

(56) References Cited

U.S. PATENT DOCUMENTS

| | | | | |
|---|---|---|---|---|
| 5,896,053 A * | 4/1999 | Prentice | ................. | H03K 5/151 327/175 |
| 5,929,710 A * | 7/1999 | Bien | ......................... | H03F 1/22 330/301 |
| 5,945,878 A * | 8/1999 | Westwick | ............... | H03F 3/193 327/359 |
| 6,441,688 B1 * | 8/2002 | Lau | ..................... | H03F 3/45237 330/257 |
| 6,850,752 B2 * | 2/2005 | Hoshino | .................. | H03F 1/22 455/281 |
| 8,421,541 B2 * | 4/2013 | Sengupta | .............. | H03F 1/3211 327/359 |

* cited by examiner

*Primary Examiner* — Patrick O'Neill
(74) *Attorney, Agent, or Firm* — Cantor Colburn LLP

(57) ABSTRACT

A single-to-differential converter and a method of fabricating the single-to-differential converter on an integrated circuit are described. The single-to-differential converter provides a pair of differential outputs based on a single-ended input and includes an input node to receive the single-ended input, and a first transistor connected to a power supply pin. A second transistor is connected to the power supply pin. The first transistor and the second transistor are biased under a same amount of direct current (DC) and the pair of differential outputs are generated at respective collectors of the first transistor and the second transistor.

20 Claims, 2 Drawing Sheets

US 9,584,073 B1

INTERNALLY MATCHED ACTIVE SINGLE-TO-DIFFERENTIAL RF CONVERTER

FIELD OF THE INVENTION

The subject invention relates to an internally matched active single-to-differential radio frequency (RF) converter.

BACKGROUND

A single-to-differential converter converts a single-ended signal to a differential signal that includes two complementary (180 degrees out of phase with each other) signals. The differential signal may be transmitted via twisted-pair cables, for example, and generally provides higher signal-to-noise ratio and is more resistant to electromagnetic interference than the single-ended signal. A single-to-differential converter may be used in a transceiver system, for example. The converter may drive an analog-to-digital converter (ADC) or be used in conjunction with a quadrature generation circuit in a phase shifter, for example. A single-to-differential converter may be implemented with passive or active elements. The passive element approach (e.g., rat-race coupler) takes up a significant amount of chip area. Current single-to-differential converters that use active elements (e.g., common-emitter amplifier with common-base amplifier) suffer accuracy issues due to mismatch between the two transistors. Accordingly, it is desirable to provide an active single-to-differential converter that requires less chip space while avoiding the accuracy issues of other active element approaches.

SUMMARY OF THE INVENTION

In an exemplary embodiment, a single-to differential converter configured to provide a pair of differential outputs based on a single-ended input includes an input node configured to receive the single-ended input; a first transistor connected to a power supply pin; and a second transistor connected to the power supply pin, the first transistor and the second transistor being biased under a same amount of direct current (DC) and the pair of differential outputs being generated at respective collectors of the first transistor and the second transistor.

According to another embodiment, a method of fabricating a single-to-differential converter on an integrated circuit includes arranging an input node to receive an input signal; arranging a first transistor such that a collector of the first transistor is coupled to a power supply pin of the integrated circuit; arranging a second transistor such that a collector of the second transistor is coupled to the power supply pin; biasing the first transistor and the second transistor under a same amount of direct current (DC); and generating a pair of differential outputs at the respective collectors of the first transistor and the second transistor.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
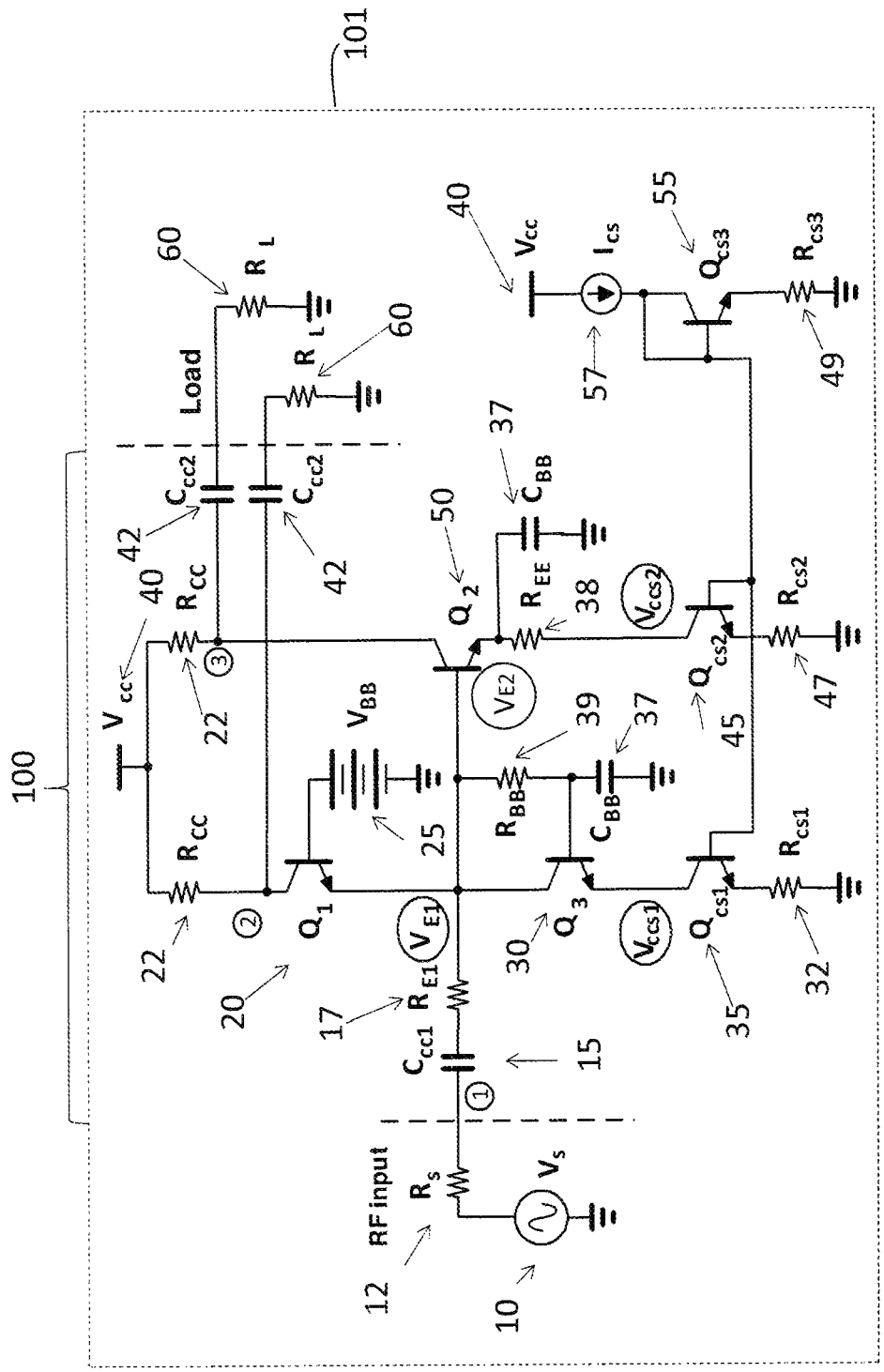
FIG. 1 is a block diagram of a wideband active single-to-differential converter according to an exemplary embodiment.

The following description is merely exemplary in nature and is not intended to limit the present disclosure, its application or uses. It should be understood that throughout the drawings, corresponding reference numerals indicate like or corresponding parts and features.

Embodiments discussed herein relate to active single-to-differential converters that rely on transistors' inherent characteristics for differential signal generation. The reliance on the inherent characteristics facilitates consistent and accurate generation of differential signals. The converters according to embodiments detailed herein improve amplitude/phase error and input and output matching at high frequencies as compared to prior approaches.

In accordance with an exemplary embodiment of the invention, a wideband active single-to-differential converter 100 is shown in FIG. 1. A voltage source Vs 10 and source impedance Rs 12 present an RF input at node 1, at the input of the single-to-differential converter 100. The single-to-differential converter 100, according to the exemplary embodiment shown in FIG. 1, includes a capacitor Ccc1 15 to isolate the direct current (DC) bias at Vs 10. The impedance $R_{E1}$ 17 is connected in series with Ccc1 15 and results in a voltage $V_{E1}$, the emitter voltage of transistor Q1 20, which is at the collector of Q3 30. Input impedance matching is achieved when $$R_S \approx R_{E1} + \frac{1}{gmQ_1} \qquad [\text{EQ. 1}]$$

In EQ. 1, gmQ1 is the transconductance of Q1 20.

The emitter voltage of Q3 30 ($V_{CCS1}$) is at the collector of $Q_{CS1}$ 35, which has degeneration impedance $R_{CS1}$ 32 at its emitter to provide the biasing current to the Q1 20 and Q3 30 branch. Capacitor $C_{BB}$ 37 and resistor $R_{BB}$ 39 connect to the base of Q3 30. $R_{BB}$ 39 also connects to the base of Q2 50. The emitter of Q2 50, with voltage $V_{E2}$, includes resistor $R_{EE}$ 38 and another $C_{BB}$ 37. The capacitors $C_{BB}$ 37 form an alternating current (AC) ground at the frequency of interest. The transistor $Q_{CS2}$ 45 base is connected to the base of $Q_{CS1}$ 35 and the base of $Q_{CS3}$ 55. Thus, $Q_{CS1}$ 35, $Q_{CS2}$ 45, and $Q_{CS3}$ 55 share the same base voltage. The purpose of the combinations of $Q_{CS1}$ 35 and $R_{CS1}$ 32 and $Q_{CS2}$ 45 and $R_{CS2}$ 47 is to provide the DC current to enable the transistors Q1 20, Q2 50, and Q3 30 to operate at the frequency of interest. This frequency may be between 22 and 29 gigahertz (GHz) (e.g., 24 GHz) or between 76 and 81 GHz (e.g., 77 GHz), for example. Resistor $R_{CS2}$ 47 is at the emitter of $Q_{CS2}$ 45. Transistors Q3 30, $Q_{CS1}$ 35, and $Q_{CS2}$ 45 facilitate temperature compensation for the single-to-differential converter 100 and ensure RF performance insensitivity to temperature variation. When the transistors, Q1 20 and Q2 50, which give rise to the two branches of the RF differential signal are biased under the same amount of DC, amplitude and phase balance is achieved. To ensure that tail current sources $Q_{CS1}$ 35 and $Q_{CS2}$ 45 have the same amount of DC, their collector voltages $V_{CSS1}$ and $V_{CSS2}$ may be controlled to be equal. These voltages are given by:

$$V_{CSS1}=V_{E1}-I_{B3}R_{BB}-V_{BE3} \quad [\text{EQ. 2}]$$

$$V_{CSS2}=V_{E1}-V_{BE2}-I_{E2}R_{EE} \quad [\text{EQ. 3}]$$

In EQ. 2, $I_{B3}$ is the current through $R_{BB}$ 39 at the base of Q3 30, and, in EQ. 3, $I_{E2}$ is the current through $R_{EE}$ at the emitter of Q2 50. By choosing the size of Q2 50 and Q3 30 such that $V_{BE2}=V_{BE3}$, and by choosing $R_{BB}$ 39 and $R_{EE}$ 38 such that $I_{B3}R_{BB}=I_{C2}R_{EE}$, then $V_{CSS1}$ and $V_{CSS2}$ can be made equal.

A constant voltage $V_{BB}$ 25 is at the base of Q1 20, and the collector of Q1 20 (node 2) provides one of the differential outputs. The collector supply voltage Vcc 40 is a power supply pin of the integrated circuit 101 on which the single-to-differential converter 100 is formed. Supply voltage Vcc 40 is at the collector of $Q_{CS3}$ 55. Current source $I_{CS}$ 57 is at the collector of $Q_{CS3}$ 55, and impedance $R_{CS3}$ 49 is at the emitter of $Q_{CS3}$ 55. $Q_{CS3}$ 55 and $R_{CS3}$ 49 form a base bias generation circuit to transform the current source $I_{CS}$ 57 into the reference base voltage so that the base bias generation circuit base voltage may be used to bias $Q_{CS1}$ 35 and $Q_{CS2}$ 45. When the RF input is applied to the single-to-differential converter 100, Vcc 40 provides a supply voltage so that the DC supply current can flow through Rcc 22 to node 2 at the collector of Q1 20 and also through Rcc 22 to node 3. Nodes 2 and 3, at the collectors of Q1 20 and Q2 50, respectively, provide outputs through capacitors $C_{cc2}$ 42 that give rise to the two outputs that are 180 degrees apart in phase (the differential signal) across $R_L$ 60. Ideally, the two outputs (across $R_L$ 60) have the same amplitude and 180 degrees phase difference.

Figure 2:
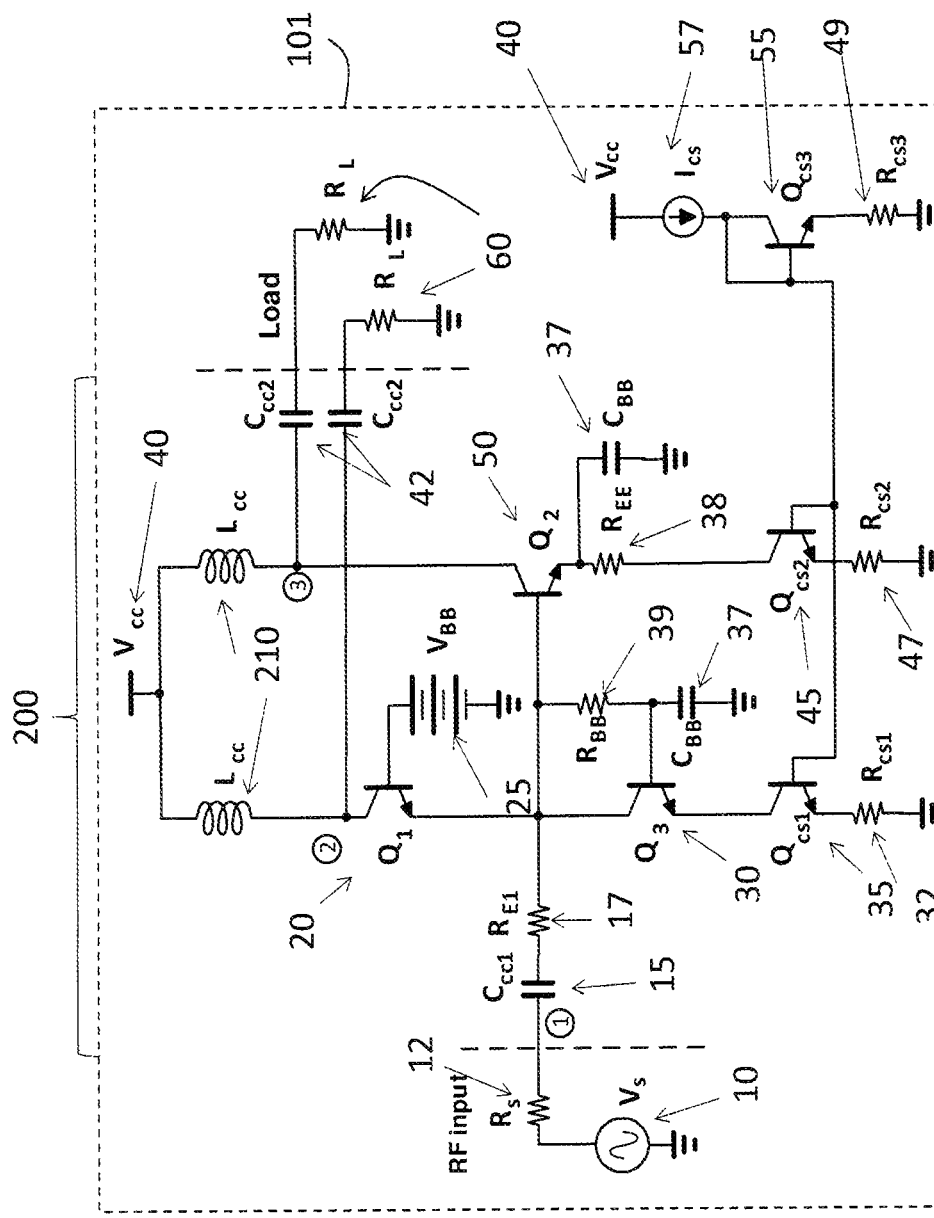
FIG. 2 is a block diagram of a narrowband active single-to-differential converter according to an exemplary embodiment.

In accordance with another exemplary embodiment of the invention, an RF narrowband active single-to-differential converter 200 is shown in FIG. 2. The single-to-differential converter 100 performance is better at lower frequencies. Thus, the current embodiment is referred to as narrowband while the previously discussed embodiment is referred to as wideband. As a comparison of FIGS. 1 and 2 indicates, the two Rcc 22 are replaced with inductors Lcc 210. This increases the gain of Q1 20 and Q2 50 and resonates out the parasitic capacitance at nodes 2 and 3 to improve high frequency performance. The center frequency may be around 77 GHz, for example, with an amplitude/gain difference within 0.3 decibels (dB) between 20 and 120 GHz. The phase difference between 20 and 120 GHz may be within 5 degrees of 180 degrees.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A single-to-differential converter configured to provide a pair of differential outputs based on a single-ended input, the converter comprising:
   an input node configured to receive the single-ended input;
   a first transistor connected to a power supply pin; and
   a second transistor connected to the power supply pin, the first transistor and the second transistor being biased under a same amount of direct current (DC) and the pair of differential outputs being generated at respective collectors of the first transistor and the second transistor.

2. The converter according to claim 1, wherein the pair of differential outputs is 180 degrees out of phase with each other.

3. The converter according to claim 1, wherein the input signal is a radio frequency (RF) signal.

4. The converter according to claim 1, further comprising a third transistor, a fourth transistor, and a fifth transistor configured to provide temperature compensation to the converter.

5. The converter according to claim 4, wherein a capacitor at a base of the third transistor forms an alternating current (AC) ground at a specified frequency.

6. The converter according to claim 5, wherein the specified frequency is between 22 gigahertz (GHz) and 29 GHz or between 76 GHz and 81 GHz.

7. The converter according to claim 4, wherein voltages at respective collectors of the fourth transistor and the fifth transistor are controlled to be equal in order to make the fourth transistor and the fifth transistor have the same amount of DC.

8. The converter according to claim 7, wherein the voltages at the respective collectors of the fourth transistor and the fifth transistor are controlled to be equal based on the second transistor and the third transistor being a same size.

9. The converter according to claim 1, further comprising an impedance between the collector of the first transistor and the power supply pin and another of the impedance between the collector of the second transistor and the power supply pin.

10. The converter according to claim 1, further comprising an inductor between the collector of the first transistor and the power supply pin and another of the inductor between the collector of the second transistor and the power supply pin.

11. A method of fabricating a single-to-differential converter on an integrated circuit, the method comprising:
    arranging an input node to receive an input signal;
    arranging a first transistor such that a collector of the first transistor is coupled to a power supply pin of the integrated circuit;
    arranging a second transistor such that a collector of the second transistor is coupled to the power supply pin;
    biasing the first transistor and the second transistor under a same amount of direct current (DC); and
    generating a pair of differential outputs at the respective collectors of the first transistor and the second transistor.

12. The method according to claim 11, wherein the generating the pair of differential outputs includes generating two outputs that are 180 degrees out of phase with each other.

13. The method according to claim 11, wherein the arranging the input node to receive the input signal includes the input node receiving a radio frequency (RF) signal.

14. The method according to claim 11, further comprising arranging a third transistor coupled to an emitter of the first transistor;
    arranging a fourth transistor coupled to an emitter of the third transistor; and
    arranging a fifth transistor coupled to an emitter of the second transistor, the third transistor, the fourth transistor, and the fifth transistor providing temperature compensation to the converter.

15. The method according to claim 14, further comprising arranging a capacitor at a base of the third transistor, the capacitor forming an alternating current (AC) ground at a specified frequency.

16. The method according to claim 15, wherein the forming the AC ground at the specified frequency is a frequency between 22 gigahertz (GHz) and 29 GHz or between 76 GHz and 81 GHz.

17. The method according to claim 14, further comprising controlling voltages at respective collectors of the fourth transistor and the fifth transistor to be equal in order to make the fourth transistor and the fifth transistor have the same amount of DC.

18. The method according to claim 17, wherein the controlling the voltages at the respective collectors of the fourth transistor and the fifth transistor includes sizing the second transistor and the third transistor to be a same size.

19. The method according to claim 11, further comprising arranging an impedance between the collector of the first transistor and the power supply pin and arranging another of the impedance between the collector of the second transistor and the power supply pin.

20. The method according to claim 11, further comprising arranging an inductor between the collector of the first transistor and the power supply pin and arranging another of the inductor between the collector of the second transistor and the power supply pin.

* * * * *